US008355226B2

United States Patent
Yoshida et al.

(10) Patent No.: US 8,355,226 B2
(45) Date of Patent: Jan. 15, 2013

(54) GROUND FAULT SENSING DEVICE

(75) Inventors: Takeshi Yoshida, Hitachiota (JP); Takao Yanai, Hitachi (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 174 days.

(21) Appl. No.: 12/868,260

(22) Filed: Aug. 25, 2010

(65) Prior Publication Data
US 2011/0080676 A1 Apr. 7, 2011

(30) Foreign Application Priority Data

Oct. 6, 2009 (JP) ................. 2009-232283

(51) Int. Cl.
*H02H 5/12* (2006.01)
*H02H 7/08* (2006.01)
(52) U.S. Cl. ................. 361/30; 361/42; 361/49; 361/31
(58) Field of Classification Search ............ 361/42, 361/49, 30, 31
See application file for complete search history.

(56) References Cited

U.S. PATENT DOCUMENTS

| 4,200,897 | A * | 4/1980 | Dawley ............ 361/45 |
| 4,868,445 | A * | 9/1989 | Wand ............ 310/316.01 |
| 5,945,802 | A * | 8/1999 | Konrad et al. ........ 318/807 |
| 6,906,525 | B2 | 6/2005 | Suzuki |
| 8,004,285 | B2 * | 8/2011 | Endou ............ 324/522 |
| 2009/0134881 | A1 | 5/2009 | Tachizaki |

FOREIGN PATENT DOCUMENTS

| EP | 1 903 651 | 3/2008 |
| EP | 1 921 457 | 5/2008 |
| JP | 2003-255012 | 9/2003 |
| JP | 2004-361309 | 12/2004 |
| JP | 3678151 | 5/2005 |
| JP | 2006-25529 | 1/2006 |

OTHER PUBLICATIONS

Flanagan, Handbook of Transformer Design and Applications, 1992, 2nd Edition, McGraw-Hill, Inc., pp. 12.28-12.29.*
Extended European Search Report issued in European Patent Application No. 10174047.0 on Feb. 16, 2011.

* cited by examiner

*Primary Examiner* — Rexford Barnie
*Assistant Examiner* — Zeev V Kitov
(74) *Attorney, Agent, or Firm* — Antonelli, Terry, Stout & Kraus, LLP.

(57) ABSTRACT

A ground fault sensing device for a drive system that converts direct current electrical power from a direct current power supply into alternating current electrical power and drives an electric motor with that alternating current electrical power, comprises: an extraction circuit that is connected to a power supply line of the direct current power supply via a coupling capacitor, that detects an amplitude wave that is generated when an alternating current side including the electric motor is suffering a ground fault, and that extracts the envelope of the amplitude wave; a measurement circuit that measures the voltage level of the envelope; and a determination circuit that makes a decision as to whether or not a ground fault has occurred on the alternating current side by comparing together the voltage level measured by the measurement circuit and a ground fault decision value.

8 Claims, 9 Drawing Sheets

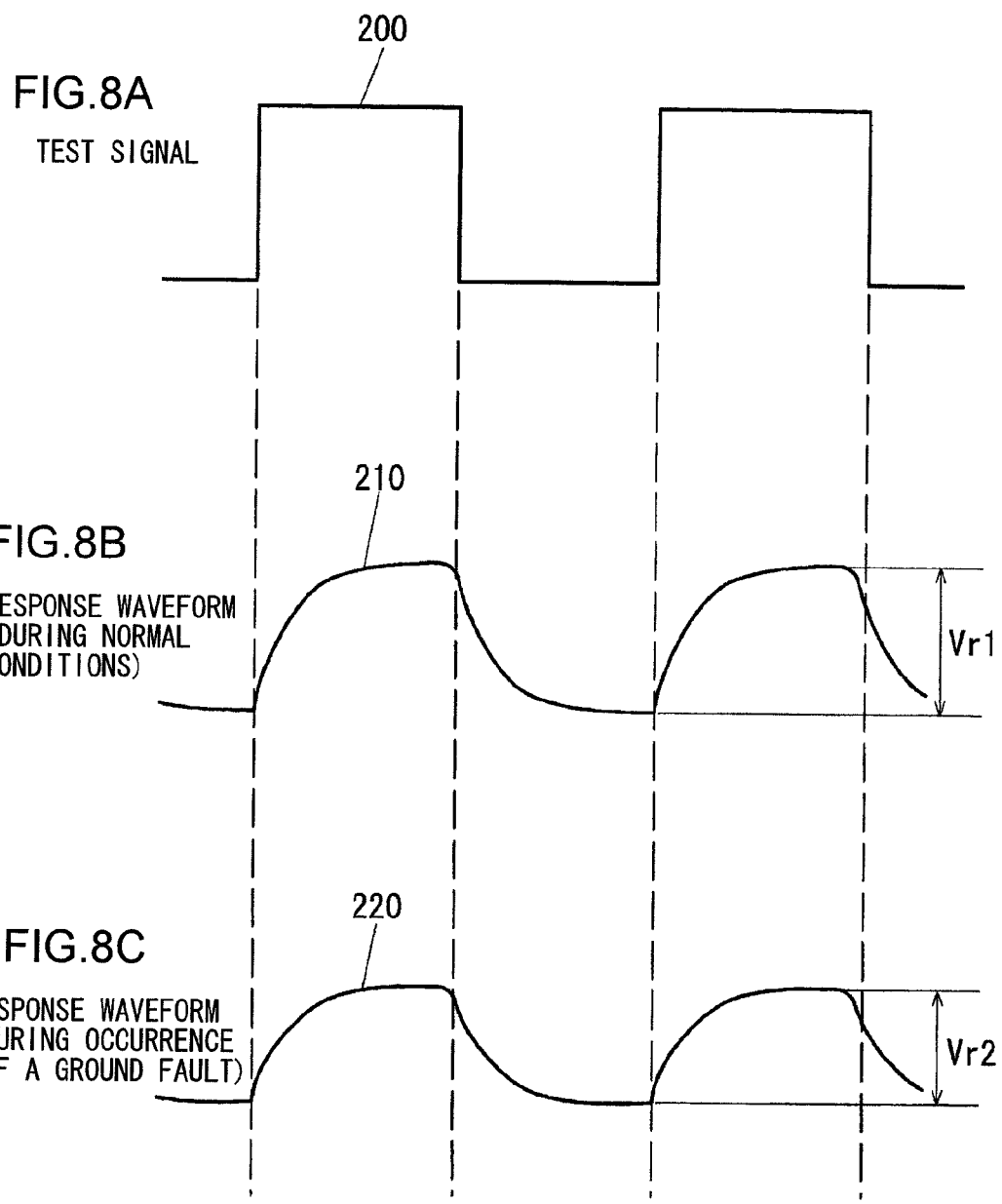

GROUND FAULT SENSING DEVICE

INCORPORATION BY REFERENCE

The disclosure of the following priority application is herein incorporated by reference: Japanese Patent Application No. 2009-232283 filed Oct. 6, 2009

BACKGROUND OF THE INVENTION

1. Field of the Invention

The present invention relates to a ground fault sensing device.

2. Description of Related Art

Since, in an electric vehicle or a hybrid electric vehicle, a high voltage battery is provided for operating devices such as an electric motor and an inverter, accordingly it is necessary to provide a ground fault sensing means for protecting the personnel riding in the vehicle from this high voltage. Due to this, technical standards have been determined for protecting the personnel riding in the vehicle from high voltage. For example, it has been made a requirement to install a device that monitors the insulation resistance between the active electrode and the electrical chassis, and that issues a warning to the driver when the value of this insulation resistance drops to 100 Ω per one volt of operating voltage.

With a prior art ground fault sensing device, principally, what is detected is the occurrence of a ground fault on the direct current side of the high voltage battery (for example, refer to Patent Document #1). Thus, with the ground fault sensing method described in Patent Document #1, a ground fault sensing signal is supplied to a direct current power supply circuit via a detection resistor and a coupling capacitor. And the amplitude of the voltage at a ground fault sensing point, which is the point of connection between the detection resistor and the coupling capacitor, is sampled at a sampling cycle that is ½ of the cycle of this periodic waveform (i.e. of the ground fault sensing signal), and determination of whether or not a ground fault is occurring is made by obtaining the difference between the voltage amplitude values detected during odd numbered sampling cycles and even numbered sampling cycles.

Patent Document #1: Japanese Patent Publication No. 3678151.

However since, with the method disclosed in Patent Document #1, it is arranged to detect the occurrence of a ground fault on the battery side (i.e. the direct current side), accordingly it is difficult to detect the occurrence of a ground fault on the electric motor side (i.e. the alternating current side). Furthermore, sometimes it may happen that the ground fault determination described above becomes difficult if a ground fault has occurred upon the alternating current side, because an amplitude wave corresponding to the rotation speed of the electric motor is superimposed via the Y-capacitor upon the periodic waveform.

SUMMARY OF THE INVENTION

A ground fault sensing device according to a 1st aspect of the present invention, which is for a drive system that converts direct current electrical power from a direct current power supply into alternating current electrical power and drives an electric motor with that alternating current electrical power, comprises: an extraction circuit that is connected to a power supply line of the direct current power supply via a coupling capacitor, that detects an amplitude wave that is generated when an alternating current side including the electric motor is suffering a ground fault, and that extracts the envelope of the amplitude wave; a measurement circuit that measures the voltage level of the envelope; and a determination circuit that makes a decision as to whether or not a ground fault has occurred on the alternating current side by comparing together the voltage level measured by the measurement circuit and a ground fault decision value.

According to a 2nd aspect of the present invention, in the ground fault sensing device of the 1st aspect, the determination circuit may compare the difference between the voltage level measured by the measurement circuit and a reference voltage level set in advance with the ground fault decision value.

According to a 3rd aspect of the present invention, the ground fault sensing device of the 1st or 2nd aspect may further comprise: a test signal output circuit that applies a ground fault testing signal having a periodic waveform to the power supply line of the direct current power supply via the coupling capacitor; and a direct current side ground fault sensing circuit that detects the response waveform when the ground fault testing signal is applied, and that detects the occurrence of a ground fault on the direct current side including the direct current power supply, on the basis of change of the response waveform. In this ground fault sensing device, it is preferred that the extraction circuit extracts the envelope of the amplitude wave superimposed upon the ground fault testing signal.

According to a 4th aspect of the present invention, in the ground fault sensing device of the 3rd aspect, it is desired that the direct current side ground fault sensing circuit determines that a ground fault has occurred on the direct current side, if the value of the amplitude of the response waveform having a periodic waveform is smaller than an amplitude value set in advance that corresponds to a ground fault.

According to a 5th aspect of the present invention, the ground fault sensing device of the 3rd of 4th aspect may further comprise a control means that performs control so that ground fault sensing for the direct current side is performed with the direct current side ground fault sensing circuit, when the electric motor is stopped, and that performs control so that ground fault sensing for the alternating current side is performed by performing extraction with the extraction circuit, performing measurement with the measurement circuit, and performing determination with the determination circuit, when the electric motor is operating.

According to a 6th aspect of the present invention, in the ground fault sensing device of the 5th aspect, it is preferred that the control means outputs a command to stop the drive system, when a ground fault on at least one of the alternating current side and the direct current side is detected.

According to a 7th aspect of the present invention, in the ground fault sensing device of any one of the 1st through 6th aspects, the ground fault decision value may be set according to the rotation speed of the electric motor.

According to an 8th aspect of the present invention, in the ground fault sensing device of any one of the 1st through 7th aspects, the extraction circuit may be an envelope detection circuit.

According to a 9th aspect of the present invention, in the ground fault sensing device of any one of the 1st through 7th aspects, the extraction circuit may be a full wave rectification circuit.

According to the present invention, it is possible to detect a ground fault on the alternating current side in a simple and easy manner.

BRIEF DESCRIPTION OF THE DRAWINGS

FIGS. 8A, 8B, and 8C are figures showing the waveform of a test signal and the response waveform, during ground fault testing on the battery side;

DESCRIPTION OF THE PREFERRED EMBODIMENTS

In the following, embodiments for implementation of the present invention will be explained with reference to the drawings.

- The First Embodiment -

Figure 1:
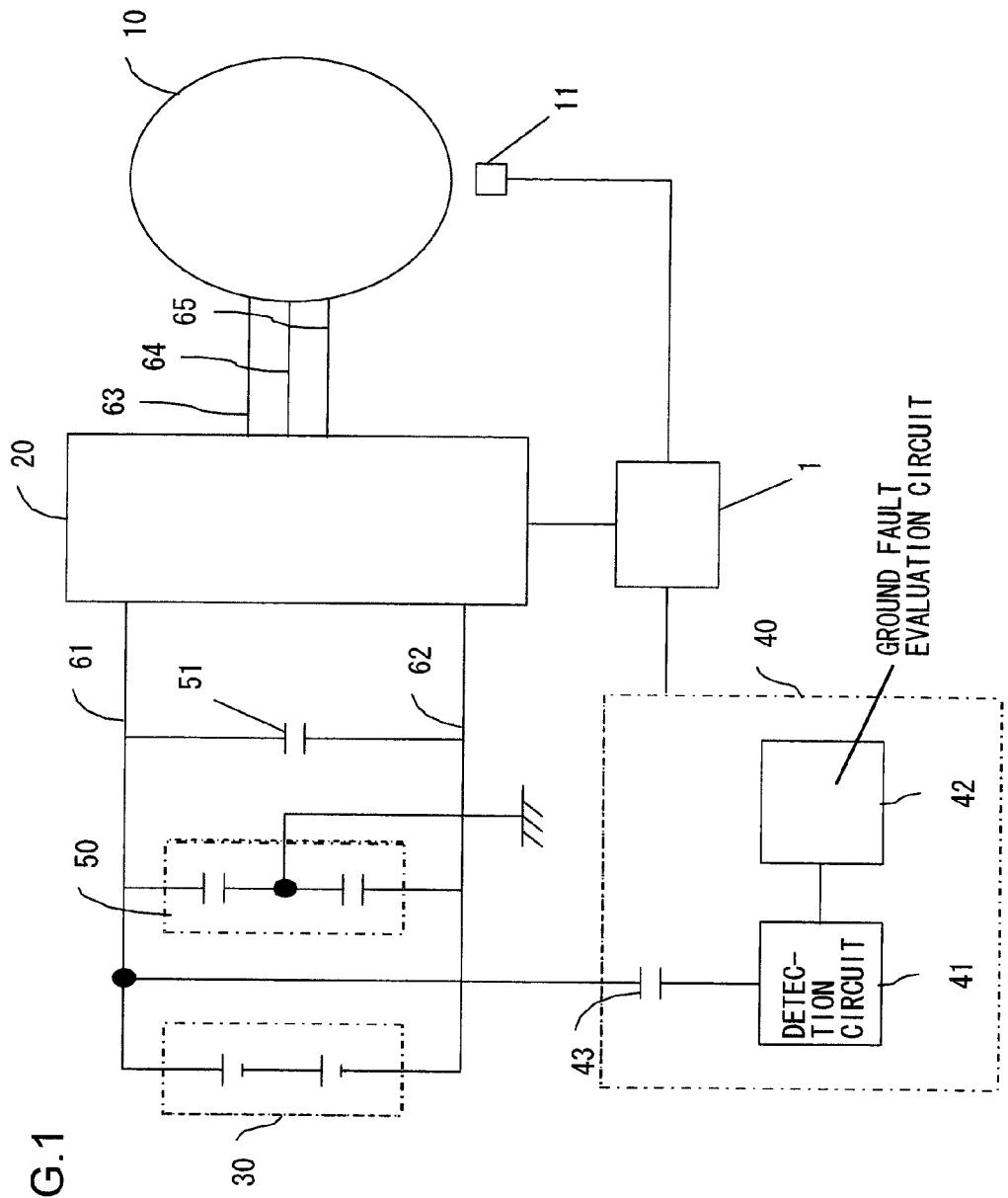
FIG. 1 is a figure for explanation of a first embodiment of the ground fault sensing device of the present invention.

FIG. 1 is a figure for explanation of a first embodiment of the ground fault sensing device of the present invention. Here, an example will be explained of a ground fault sensing device for a vehicle drive system in which an electric motor is driven by a battery via an inverter. It should be understood that ground fault sensing for the electric motor side (i.e. for the alternating current side) by this first embodiment will be explained.

This drive system includes a main controller 1, a three-phase alternating current electric motor 10 (hereinafter termed the "electric motor"), an inverter 20, a battery 30 that serves as a direct current power supply, and a ground fault sensing device 40. The battery 30 is a battery group that provides a high voltage direct current power supply (the output voltage VB may, for example, be 340 V), and this battery is electrically insulated from the body of the vehicle (not shown in the figures). The battery 30 and the inverter 20 are connected by a positive side bus bar 61, which is a positive side direct current power supply line, and a negative side bus bar 62, which is a negative side direct current power supply line. The inverter 20 is an electrical power conversion device that converts direct current power into alternating current power. When direct current power is supplied from the battery 30 to the inverter 20, the inverter 20 converts this direct current power into alternating current power that is supplied to the electric motor 10.

A capacitor 51 constitutes a smoothing circuit that suppresses fluctuations of the direct current voltage generated by the switching operation of the inverter 20. Moreover, a line bypass capacitor (i.e. a Y-capacitor) 50 is provided to the positive and negative side bus bars 61 and 62 for eliminating noise superimposed upon the direct current power supply. The supply of alternating current power from the inverter 20 to the electric motor 10 is performed via cables for three phases: a U-phase cable 63, a V-phase cable 64, and a W-phase cable 65. The rotation speed of the electric motor 10 is detected by a rotation speed sensor 11, and the resulting detection signal is input to a main controller 1.

The ground fault sensing device 40 is connected to the positive side bus bar 61. It should be understood that this ground fault sensing device 40 could also be connected to the negative side bus bar 62. The ground fault sensing device 40 includes a detection circuit 41 and a ground fault evaluation circuit 42. The detection circuit 41 is a circuit that extracts an envelope from an amplitude wave that is generated in the power supply line during a ground fault of the electric motor, and it is connected to the positive side bus bar 61 via a coupling capacitor 43. The direct current component in the positive side bus bar 61 is intercepted by this coupling capacitor 43. And the ground fault evaluation circuit 42 monitors the voltage level of this envelope detected by the detection circuit 41, and determines that a ground fault has occurred on the electric motor side when this voltage level exceeds a threshold value.

Figure 2:
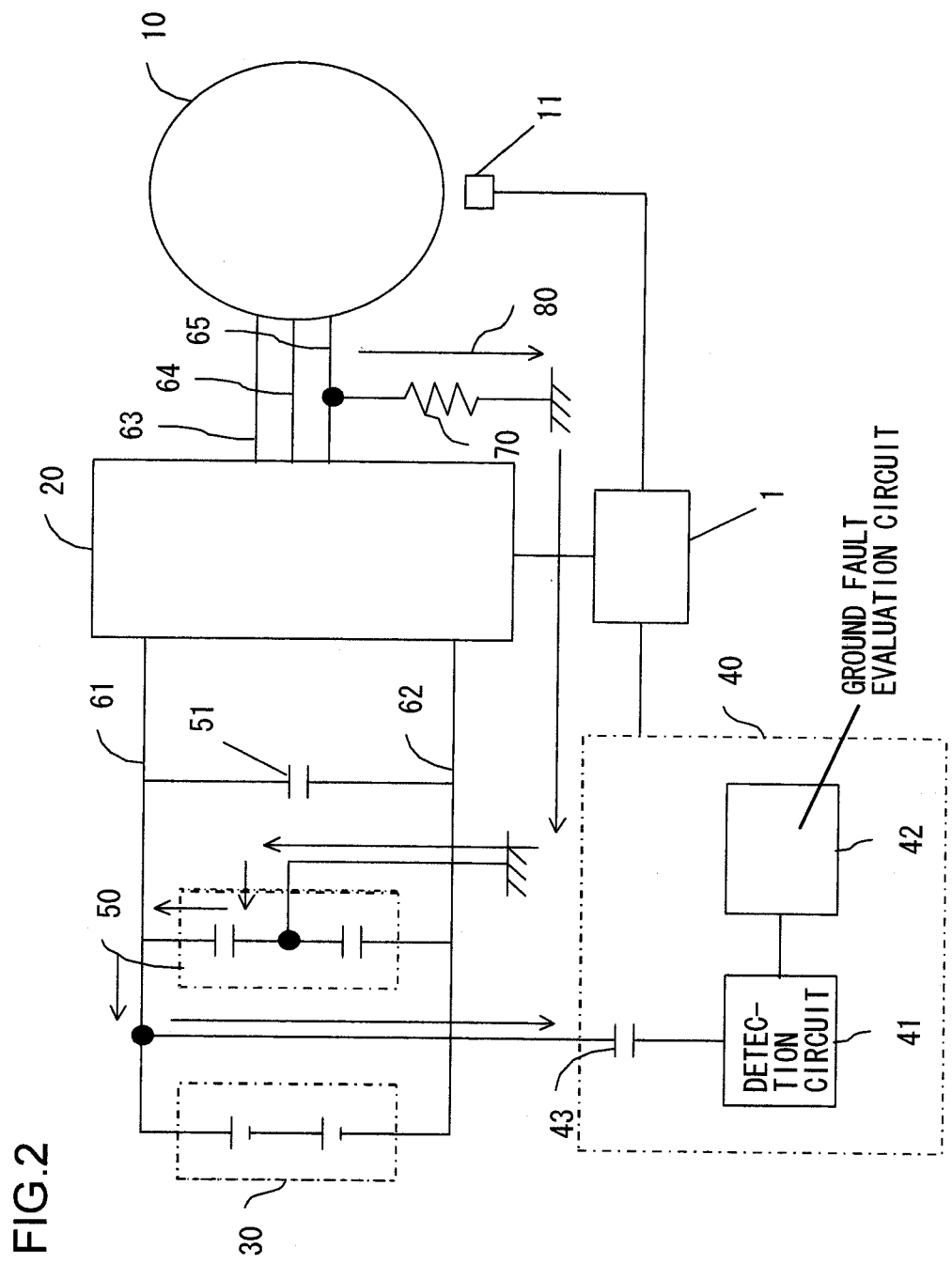
FIG. 2 is a figure for explanation of the situation when a ground fault has occurred on the alternating current side.

FIG. 2 is a figure for explanation of the situation when a ground fault has occurred on the alternating current side. Here, a case is shown in which a ground fault has occurred in the W-phase cable of the electric motor 10. Due to this ground fault, a ground fault resistance 70 is equivalently created between the W-phase cable and ground potential. Now, the electric motor 10 may be considered as a source of voltage when it is rotating, since an inductive voltage is generated in the stator winding at this time. Because of this, if a ground fault has occurred on the alternating current side in which the load of the electric motor is imposed, then, due to the influence of this source of voltage, an amplitude wave, i.e. a voltage level fluctuation, is generated in the power supply line.

For example, when a ground fault has occurred in the W-phase of the electric motor 2 as shown in FIG. 2, then this source of voltage consists of a two phase alternating current component generated by the other phases (i.e. the U-phase and the V-phase). As shown by the arrow sign denoted by the symbol 80 in FIG. 2, the generated amplitude wave is input to the ground fault sensing device 40 along a path via the ground fault resistance 70, the grounded point of the Y-capacitor 50, and the coupling capacitor 43.

Figure 3A:
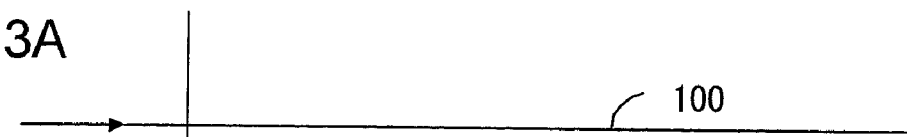
FIGS. 3A, 3B, and 3C are figures for explanation of amplitude waves.
Figure 3B:
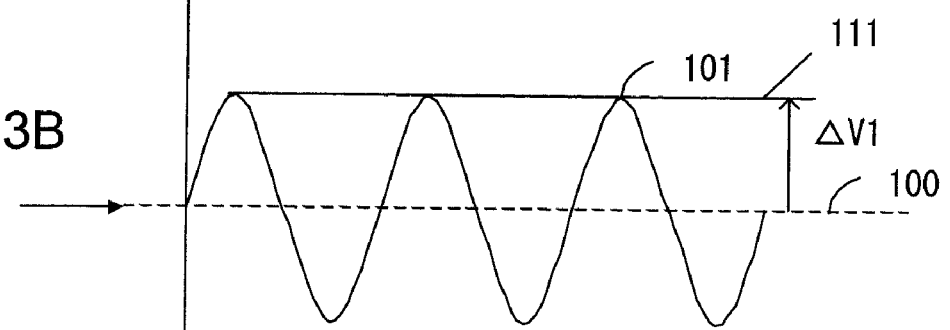
Figure 3C:
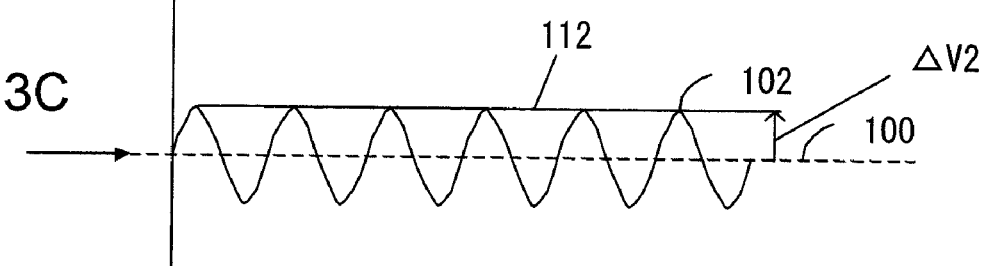

FIGS. 3A, 3B, and 3C are figures for explanation of amplitude waves generated during a ground fault of the electric motor; in these figures, the voltage level is shown along the vertical axis. FIG. 3A shows an example of the waveform when the electric motor 10 is not suffering any ground fault. Since no amplitude wave is generated in this case, the level V100 of the voltage on the side of the ground fault sensing device 40 that is connected via the coupling capacitor 43 is constant. On the other hand, when a ground fault is occurring in the electric motor 10, the previously described amplitude wave is superimposed upon the voltage of the power supply line, so that an amplitude wave V101 or V102 is detected, as shown in FIGS. 3B and 3C.

The frequency of this amplitude wave V101 or V102 changes according to the characteristics of the electric motor 10 (its rotation speed, the number of its poles, and so on). In concrete terms, the frequency of the amplitude wave is linked to a value calculated from the equation f=NP/120 (where N is the rotation speed and P is the number of poles). FIG. 3B shows a case in which the rotation speed is low, while FIG. 3C shows a case in which the rotation speed is high. Moreover, along with the amplitude wave having a frequency that is linked to the rotation speed N, also the value of its amplitude is smaller, the higher is the rotation speed N.

In this embodiment, it is arranged to decide whether or not a ground fault is occurring by monitoring this type of fluctuation of the voltage level, in other words by monitoring fluctuation of the voltage level from the reference voltage level as shown by the line 100 in FIG. 3. The lines 111 and 112 are the respective envelopes of the amplitude waves V101 and V102. The voltage levels of these envelopes 111 and 112 are higher than the reference voltage level by $\Delta V1$ and $\Delta V2$. For example, while it is arranged to determine that a ground fault is occurring if this type of voltage level fluctuation $\Delta V1$ or $\Delta V2$ exceeds a threshold value, since the fluctuation $\Delta V$ varies according to the rotation speed N, accordingly it is also arranged to perform the setting of this threshold value according to the rotation speed detected by the rotation speed sensor 11.

For example, a plurality of threshold values may be stored as a table according to the rotation speed, and a threshold value may be selected according to the detected rotation speed and the table. If the ground fault decision is to be performed by the ground fault sensing device 40, then this table is stored within the ground fault sensing device 40; while, if the ground fault decision is to be performed by the main controller 1, then this table is stored within the main controller 1. Instead of such a table, it would also be acceptable to arrange to set the threshold value by substituting the rotation speed into a calculation equation.

Figure 4:
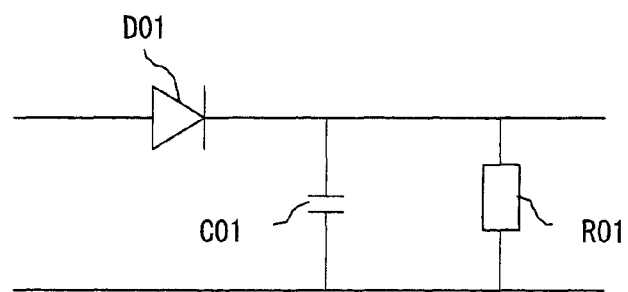
FIG. 4 is a figure showing a first example of a detection circuit.
Figure 5:
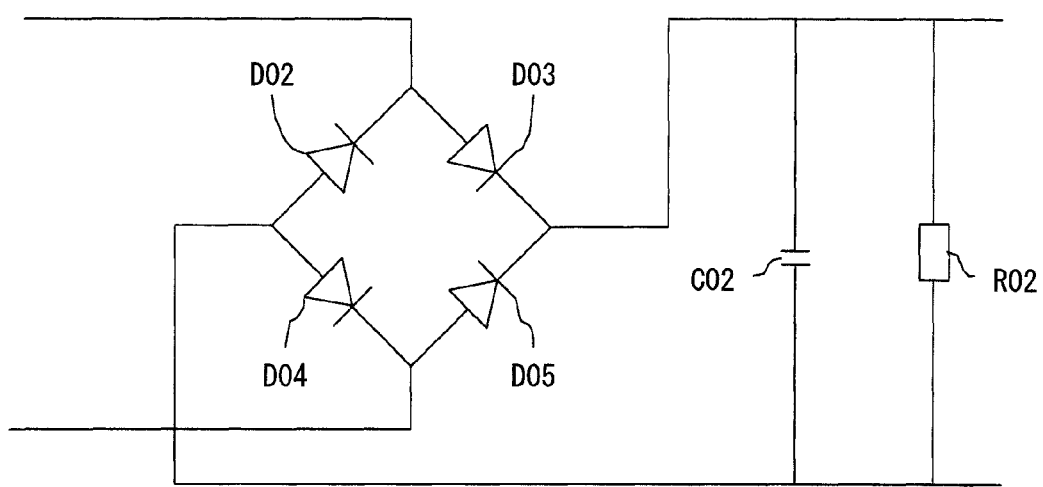
FIG. 5 is a figure showing a second example of a detection circuit.

As previously described, the detection circuit 41 is a circuit that extracts the envelope of the amplitude wave; in concrete terms, it has a structure as shown in FIG. 4 or FIG. 5. A first example shown in FIG. 4 is a so-called envelope detection circuit that includes a time constant circuit in which a resistor R01 and a capacitor C01 are combined at a stage after diode wave detection (by a diode D01). It is possible to extract the envelope of the signal waveform by matching the time constant to the cycle of the signal that is to be detected. The amplitude wave that is input via the coupling capacitor 43 is rectified by the diode D01. And the high frequency component in the output is eliminated by the capacitor C01, while the low frequency component is smoothed by this capacitor C01.

It should be understood that, if the time constant of the capacitor C01 and the resistor R01 is large, then the slope of the voltage drop of the discharge due to the capacitor C01 is less than the slope of the envelope of the amplitude wave, so that a normal output waveform is not obtained. Due to this, the time constant of the capacitor C01 and the resistor R01 is set appropriately by the detection circuit 41, so that the output waveform is close to the envelope of the input waveform. It is possible to keep the cost of the detection circuit 41 low, since the number of components is small and moreover the components themselves are cheap.

The ground fault evaluation circuit 42 detects the voltage of the envelope obtained by the detection circuit 41. And $\Delta V1$ or $\Delta V2$ is obtained by taking the difference between this detected voltage and a reference voltage level. Thus, the ground fault evaluation circuit 42 makes its ground fault determination on the basis of $\Delta V1$ or $\Delta V2$: for example, it may determine that a ground fault is occurring if $\Delta V1$ or $\Delta V2$ is greater than a threshold value. In this case, the threshold value for the ground fault determination is set according to the rotation speed, since the fluctuation $\Delta V$ varies according to the rotation speed.

In a second example shown in FIG. 5, the detection circuit 41 is built as a full wave rectification circuit that includes four diodes D02 through D05. It is arranged to perform full wave rectification upon the amplitude wave that is input with this diode bridge, and for the output thereof to be received by the parallel circuit of a resistor R02 and a capacitor C02.

In this way, in this first embodiment, by providing the detection circuit 41, it is arranged to extract the envelope of the amplitude wave generated due to a ground fault on the electric motor side, and to detect whether or not a ground fault has occurred on the electric motor side on the basis of fluctuation of the voltage level of this envelope. Due to this, it is possible simply and easily to detect the occurrence of a ground fault on the electric motor side. Moreover, while the voltage level of the envelope changes according to the rotation speed of the electric motor, it is possible to perform the ground fault determination even more reliably, since it is arranged to set the threshold value for this ground fault determination according to the rotation speed of the electric motor.

Furthermore, the circuit that makes the decision as to the voltage level of the envelope can be built simply, and this implies a low cost of manufacture.

- The Second Embodiment -

Figure 6:
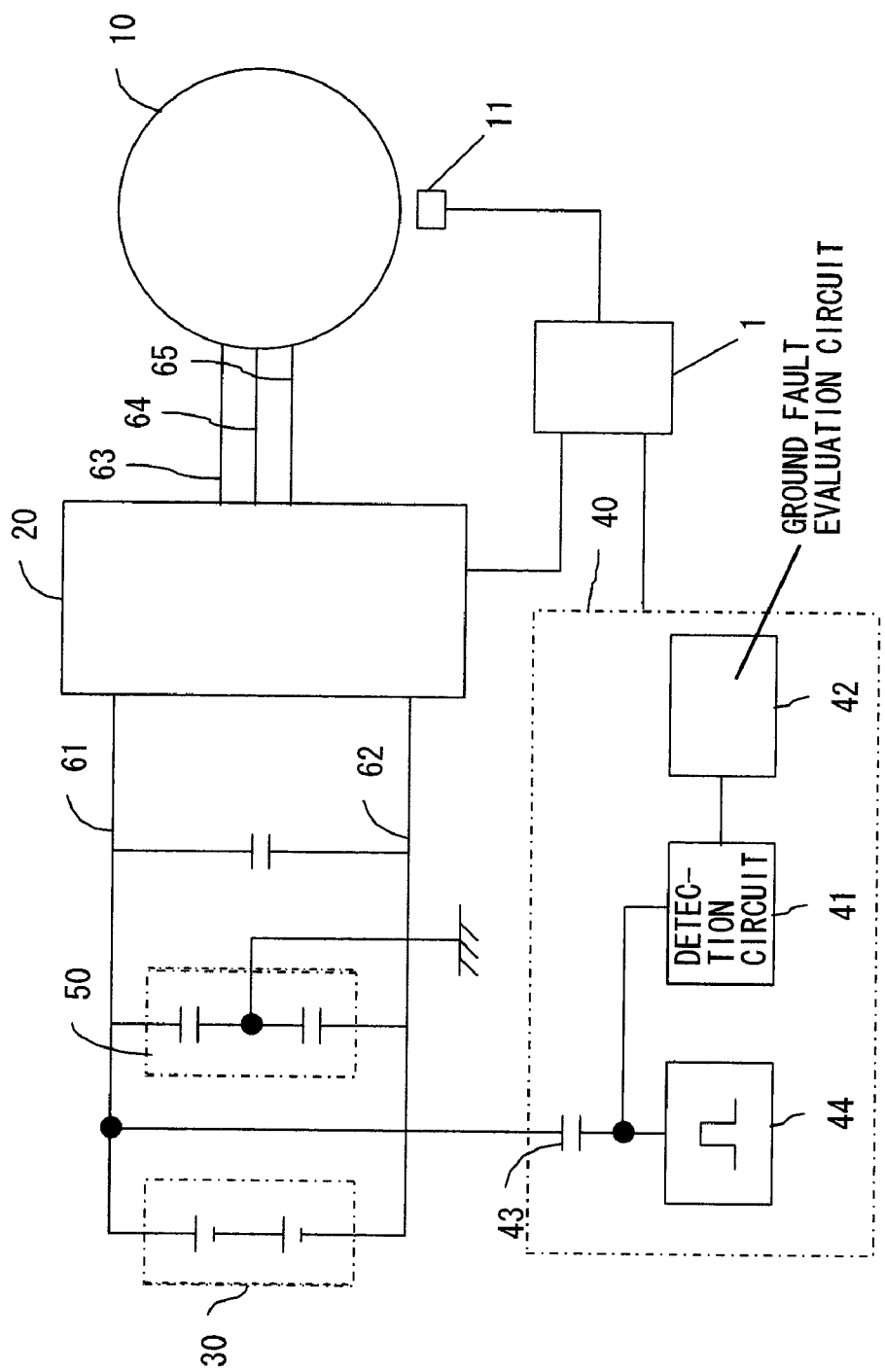
FIG. 6 is a figure for explanation of a second embodiment of the ground fault sensing device of the present invention.

FIG. 6 is a figure for explanation of a second embodiment of the ground fault sensing device of the present invention. This ground fault sensing device 40 includes a detection circuit 41, a ground fault evaluation circuit 42, a coupling capacitor 43, and a waveform output circuit 44. While in the first embodiment a ground fault sensing device was explained that detects the occurrence of a ground fault on the electric motor side, in this second embodiment, a structure is provided that is able to detect both the occurrence of a ground fault on the electric motor side (i.e. the alternating current side), and also the occurrence of a ground fault on the battery side (i.e. the direct current side). Due to this, this detection circuit includes both a circuit that handles the occurrence of a ground fault on the electric motor side, and also a circuit that handles the occurrence of a ground fault on the battery side.

Figure 7:
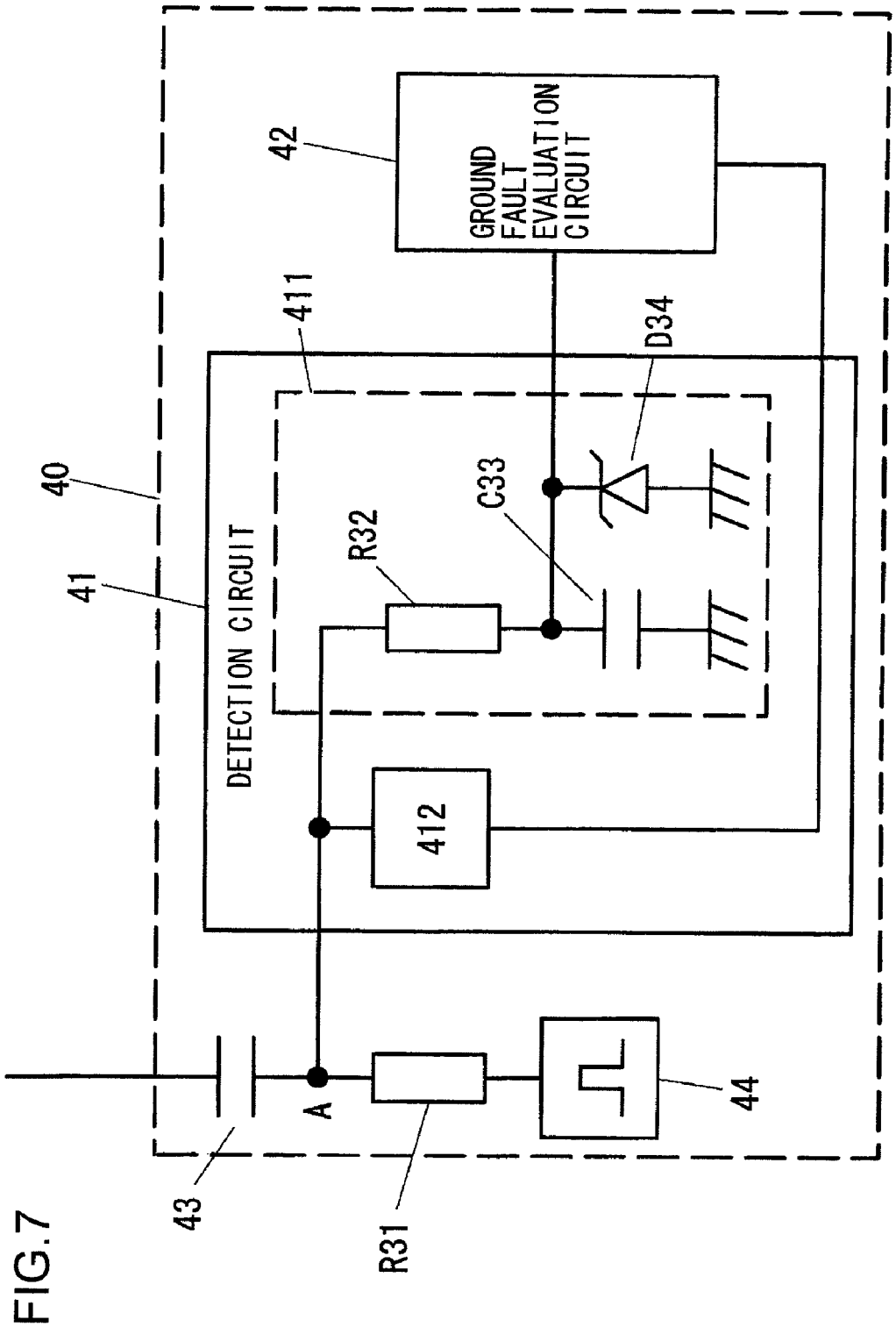
FIG. 7 is a figure showing an example of a detection circuit in this second embodiment.

FIG. 7 is a figure showing an example of this detection circuit 41. A circuit 411 is a circuit that handles the occurrence of a ground fault on the electric motor side, and that extracts the envelope of the amplitude wave in a similar manner to the detection circuit 41 of the first embodiment. In concrete terms, it has a structure as shown in FIG. 4 or in FIG. 5. On the other hand, a circuit 412 is a circuit that handles the occurrence of a ground fault on the battery side, and that includes a resistor R32, a capacitor C33, and a Zener diode D34. The combined structure of this circuit 412 and the waveform output circuit 44 constitutes a conventional ground fault sensing circuit of the alternating current voltage division type.

The waveform output circuit 44 outputs a signal (hereinafter termed the "test signal") for ground fault testing, having a periodic waveform. For example, as this test signal, the circuit 44 may output a square wave signal of duty ratio 50% and frequency 10 Hz that has amplitude of 0 to 5 V This test signal is superimposed upon the positive side bus bar 61, which is the subject circuit for evaluation.

In ground fault sensing of the alternating current voltage division type, this test signal (alternating current signal) from the waveform output circuit 44 is applied via a detection resistor R31 and a coupling capacitor 43, and it is arranged to detect change of the insulation resistance from change of the amplitude of the response waveform at the point of connection A between the detection resistor R31 and the coupling capacitor 43. FIG. 8A is a figure showing an example of the test signal that is superimposed on the positive side bus bar 61 via the coupling capacitor 43. And FIGS. 8B and 8C are figures showing the response waveform at the point of connection A, when a square wave signal as shown in FIG. 8A is applied. It should be understood that the corruption of the waveform during its rise and its fall is due to delay and so on.

The response waveform of FIG. 8B is one that represents the waveform during normal conditions, in which no ground fault is occurring on either the battery side or the electric motor side. The amplitude at this time is Vr1. On the other hand, since the ground fault resistance is added to the impedance on the vehicle side when a ground fault is occurring on the battery side, accordingly the amplitude Vr2 of the response waveform shown in FIG. 8C becomes smaller than the amplitude Vr1 when no ground fault is occurring. The ground fault evaluation circuit 42 makes a decision as to whether or not a ground fault has occurred on the battery side by considering the change in the amplitude of this response waveform. Actually, an amplitude value that corresponds to the presence of a ground fault is set in advance as a threshold value, and it is determined that a ground fault has occurred on the direct current side if the value of the amplitude of the response waveform is smaller than this threshold value.

Figure 9A:
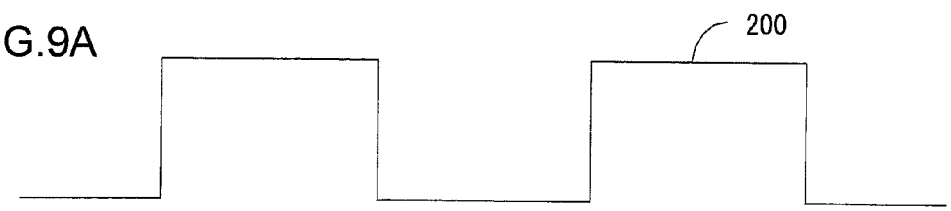
FIGS. 9A, 9B, 9C, and 9D are figures showing the waveform of a test signal, the response waveform, and the envelope, during ground fault testing on the electric motor side.
Figure 9B:
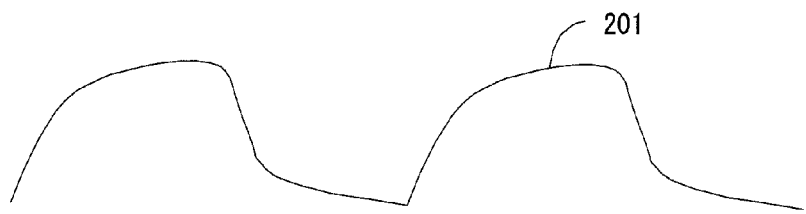
Figure 9C:
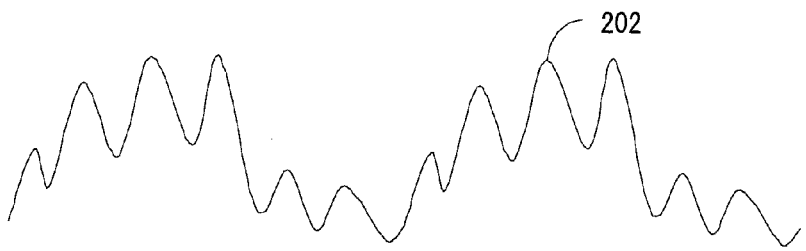

FIGS. 9A, 9B, 9C, and 9D are figures for explanation of the response waveforms when a ground fault has occurred on the electric motor side. FIG. 9A is a figure showing a detection signal (an output waveform) 200, and is the same as FIG. 8A. And FIG. 9B is a figure showing the response waveform during normal conditions, and is the same as FIG. 8B. Moreover, FIG. 9C is a figure showing the response waveform when a ground fault has occurred on the electric motor side. When a ground fault is occurring on the electric motor side, an amplitude wave of a frequency linked to the rotation speed of the electric motor 10 comes to be superimposed upon the waveform shown in FIG. 8B.

Figure 9D:
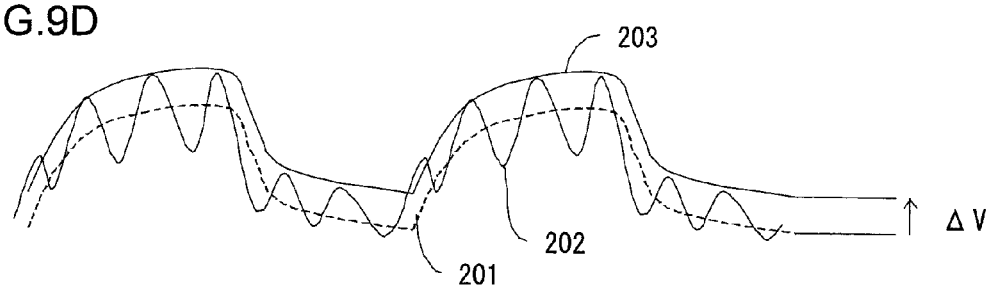

When the signal (the response wave) having the waveform 202 as shown in FIG. 9C is supplied to the circuit 412 in which is a circuit that obtains the envelope of this amplitude wave, an envelope like that shown by the reference symbol 203 in FIG. 9D is extracted. FIG. 9D is a figure showing the waveform 201 when no ground fault is occurring, the waveform 202 in which an amplitude wave is superimposed upon the test signal, and the envelope 203, all mutually superimposed. If the voltage level of the waveform 201 when no ground fault is occurring is taken as being the reference level, then a fluctuation of ΔV with respect to this reference level is generated in the voltage level of the envelope 203 that is obtained from the amplitude wave. If this voltage level fluctuation ΔV is greater than the threshold value, then it is determined that a ground fault is occurring.

Ground Fault Sensing Operation

Figure 10:
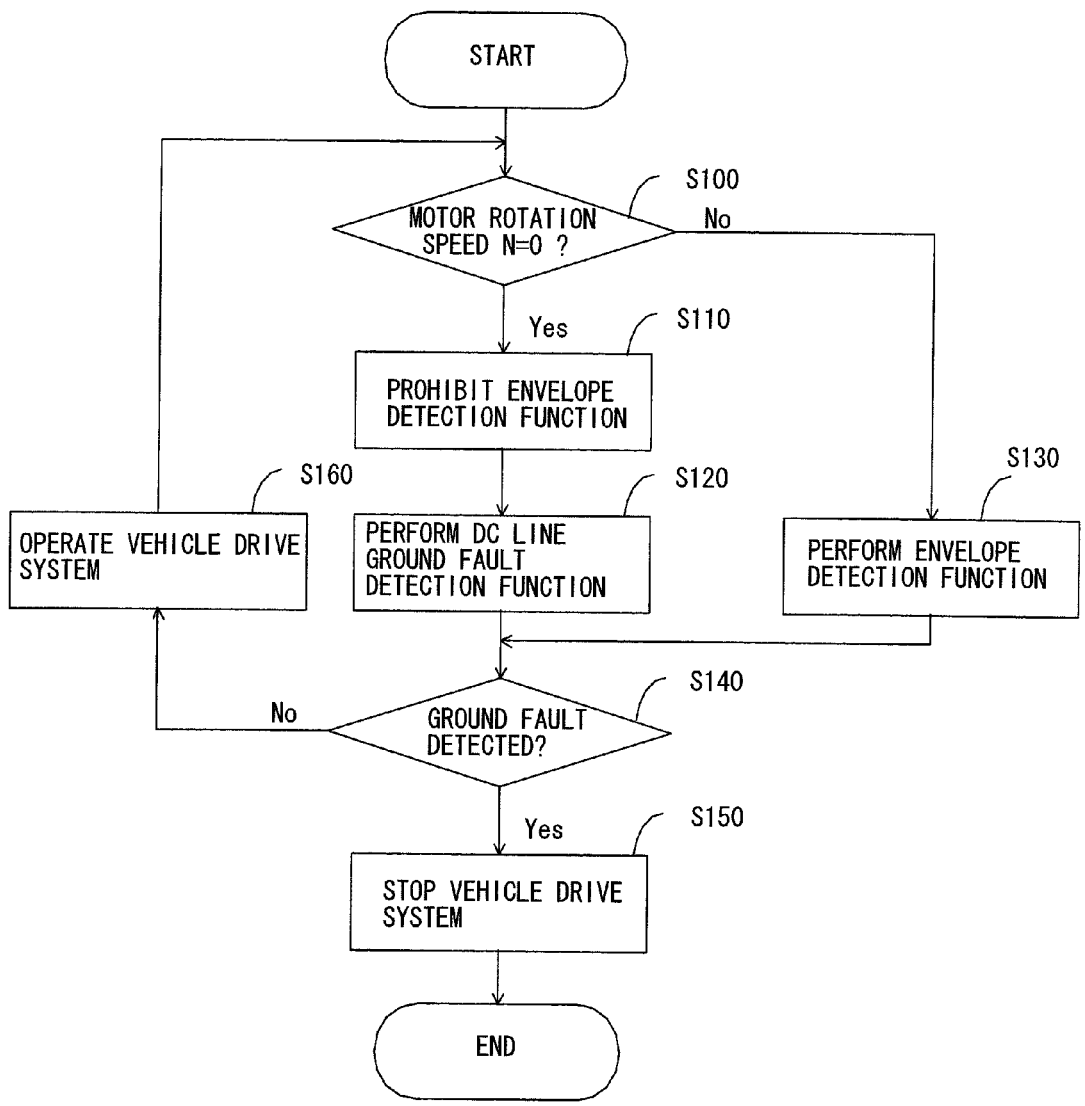
FIG. 10 is a flow chart showing an example of ground fault sensing operation.

FIG. 10 is a flow chart showing an example of ground fault sensing operation by the ground fault sensing device shown in FIGS. 7 and 8. While here this control is explained as being performed by the main control device, it would also be acceptable for it to be performed by the ground fault evaluation circuit 42. The processing shown in this flow chart starts when, for example, the main switch of the vehicle is turned to ON. In a first step S100, a decision is made as to whether or not the electric motor 10 is in the stopped state or the operating state. In other words, if the rotation speed N of the electric motor is equal to zero, then it is decided that the motor is in the stopped state, and the flow of control proceeds to a step S110. On the other hand, if the rotation speed N is greater than zero, then it is decided that the motor is in the operating state, and the flow of control is transferred to a step S130.

If the flow of control has reached the step S110, then no envelope can be obtained since the electric motor 10 is not rotating, even if, hypothetically, it is supposed that a ground fault has occurred on the electric motor side, since no amplitude wave is being generated. Accordingly it is necessary to prohibit the function of ground fault sensing by envelope detection, so a command is issued for prohibition of the envelope detection function. And in the next step S120 a command is issued to perform the direct current line ground fault sensing function. In other words, ground fault sensing upon the battery side is performed using the circuit 412 of FIG. 9. That is, the amplitude value of the response waveform (Vr1 or Vr2 in FIG. 8) measured by the ground fault evaluation circuit 42 and the threshold value for ground fault decision are compared together. The threshold value for ground fault decision is a value that is obtained by converting the insulation resistance value into a voltage level.

When the flow of control passes from the step S120 to the step S140, a decision is made as to whether or not a ground fault is occurring on the battery side. If the amplitude value is less than the threshold value, then it is decided that a ground fault has occurred, and the flow of control proceeds to a step S150. Conversely, if the amplitude value is greater than or equal to the threshold value, then it is decided that no ground fault has occurred, and the flow of control is transferred to a step S160.

If in the step S140 it has been decided that a ground fault is occurring and the flow of control has proceeded to the step S150, then the drive system of the vehicle is stopped, and this sequence for ground fault sensing operation terminates. On the other hand, if it has been decided that no ground fault is occurring and the flow of control has been transferred to the step S160, then the operation of the drive system of the vehicle is continued, and the flow of control returns to the step S100.

On the other hand, if in the step S100 it is decided that the rotation speed N of the electric motor 10 is greater than zero and the flow of control has been transferred to the step S130, then, in this step S130, ground fault sensing operation is performed using the detection circuit 412 that performs ground fault detection for the electric motor side. In other words, the ground fault evaluation circuit 42 measures the voltage level of the envelope obtained by the detection circuit 412, and compares together the fluctuation ΔV of the voltage level with respect to the reference level, and the threshold value. And, when the flow of control has been transferred from the step S130 to the step S140, then a decision is made from the result of the comparison in the step S130 as to whether or not a ground fault is occurring on the electric motor side. If it is decided that a ground fault is occurring, then the flow of control proceeds to the step S150, whereas if it is decided that no ground fault is occurring, then the flow of control is transferred to the step S160.

As described above, in this second embodiment, in addition to a ground fault sensing device according to the prior art that detects the occurrence of a ground fault on the battery side (i.e. on the direct current side), there is also provided the circuit 412 that obtains the envelope of the amplitude wave generated due to the occurrence of a ground fault on the electric motor side (i.e. on the alternating current side). And it is arranged reliably to perform ground fault detection upon the battery side without being influenced by the amplitude wave, by detecting the occurrence of a ground fault on the battery side in the state in which the electric motor 10 is not rotating. If due to this detection it has been confirmed that no ground fault is occurring on the battery side, then ground fault detection upon the electric motor side is performed in the state in which the electric motor 10 is rotating. And, if it is confirmed that the electric motor side is not suffering from the occurrence of a ground fault, then it may be considered that the reliability of the ground fault testing for the direct current side by the circuit 411 was sufficiently high. In other words, according to the structure of this second embodiment, it is possible reliably to detect the occurrence of a ground fault both upon the battery side and upon the electric motor side, so that enhancement of the safety may be anticipated.

The embodiments described above may be employed individually, or in combination. This is because it is possible to obtain the advantageous effects of these various embodiments either singly, or in synergy. Moreover, the present invention is not to be considered as being limited by the details of the embodiments disclosed above, provided that its distinguishing features are maintained. For example, while in the embodiments described above a square wave pulse signal was applied as the test signal, it would also be possible to employ some other signal that changes cyclically, rather than a square wave signal.

What is claimed is:

1. A ground fault sensing device for a drive system that converts direct current electrical power from a direct current power supply into alternating current electrical power and drives an electric motor with that alternating current electrical power, comprising:
    an extraction circuit that is connected to a power supply line of the direct current power supply via a coupling capacitor, that detects an amplitude wave that is generated when an alternating current side including the electric motor is suffering a ground fault, and that extracts the envelope of the amplitude wave;
    a measurement circuit that measures the voltage level of the envelope; and
    a determination circuit that makes a decision as to whether or not a ground fault has occurred on the alternating current side by comparing together the voltage level measured by the measurement circuit and a ground fault decision value,
    wherein the ground fault decision value is set according to the rotation speed of the electric motor.

2. A ground fault sensing device according to claim 1, wherein:
    the determination circuit compares the difference between the voltage level measured by the measurement circuit and a reference voltage level set in advance with the ground fault decision value.

3. A ground fault sensing device according to claim 1, further comprising:
    a test signal output circuit that applies a ground fault testing signal having a periodic waveform to the power supply line of the direct current power supply via the coupling capacitor; and
    a direct current side ground fault sensing circuit that detects the response waveform when the ground fault testing signal is applied, and that detects the occurrence of a ground fault on the direct current side including the direct current power supply, on the basis of change of the response waveform, wherein:
    the extraction circuit extracts the envelope of the amplitude wave superimposed upon the ground fault testing signal.

4. A ground fault sensing device according to claim 3, wherein:
    the direct current side ground fault sensing circuit determines that a ground fault has occurred on the direct current side, if the value of the amplitude of the response waveform having a periodic waveform is smaller than an amplitude value set in advance that corresponds to a ground fault.

5. A ground fault sensing device according to claim 3, further comprising:
    a control means that performs control so that ground fault sensing for the direct current side is performed with the direct current side ground fault sensing circuit, when the electric motor is stopped, and that performs control so that ground fault sensing for the alternating current side is performed by performing extraction with the extraction circuit, performing measurement with the measurement circuit, and performing determination with the determination circuit, when the electric motor is operating.

6. A ground fault sensing device according to claim 5, wherein:
    the control means outputs a command to stop the drive system, when a ground fault on at least one of the alternating current side and the direct current side is detected.

7. A ground fault sensing device according to claim 1, wherein:
    the extraction circuit is an envelope detection circuit.

8. A ground fault sensing device according to claim 1, wherein:
    the extraction circuit is a full wave rectification circuit.

* * * * *